(12) United States Patent
Newmark et al.

(10) Patent No.: US 7,689,953 B1
(45) Date of Patent: Mar. 30, 2010

(54) METHOD AND APPARATUS FOR DETERMINING CELL-BASED TIMING ELEMENTS FROM A TRANSISTOR-LEVEL DESIGN

(75) Inventors: David M. Newmark, Austin, TX (US); Mahesh S. Sharma, Austin, TX (US)

(73) Assignee: Globalfoundries Inc., Grand Cayman (KY)

( * ) Notice: Subject to any disclaimer, the term of this patent is extended or adjusted under 35 U.S.C. 154(b) by 650 days.

(21) Appl. No.: 11/334,220

(22) Filed: Jan. 18, 2006

(51) Int. Cl.
*G06F 17/50* (2006.01)

(52) U.S. Cl. ............ 716/6; 716/1; 716/2; 716/18

(58) Field of Classification Search .......... 703/14; 716/1–6, 17–18
See application file for complete search history.

(56) References Cited

U.S. PATENT DOCUMENTS

| | | | |
|---|---|---|---|
| 5,305,229 A * | 4/1994 | Dhar ........................ 703/14 |
| 6,405,348 B1 * | 6/2002 | Fallah-Tehrani et al. ....... 716/4 |
| 6,505,323 B1 * | 1/2003 | Lipton et al. ................. 716/3 |
| 6,574,786 B1 * | 6/2003 | Pohlenz et al. .............. 716/17 |
| 2003/0037306 A1 * | 2/2003 | Gutwin et al. ................ 716/6 |
| 2003/0140319 A1 * | 7/2003 | Bhattacharya et al. ......... 716/2 |
| 2004/0167756 A1 * | 8/2004 | Yonezawa .................... 703/2 |
| 2004/0255257 A1 * | 12/2004 | Ratzlaff ...................... 716/6 |
| 2005/0138588 A1 * | 6/2005 | Frenkil ....................... 716/6 |
| 2005/0177334 A1 * | 8/2005 | Hirano et al. ............... 702/117 |

* cited by examiner

*Primary Examiner*—Paul Dinh
(74) *Attorney, Agent, or Firm*—Williams, Morgan & Amerson, P.C.

(57) ABSTRACT

The present invention provides a method and apparatus for determining cell-based timing elements based on a transistor-level circuit design. The method may include accessing information indicative of a transistor-level circuit design determining at least one component of at least one cell based on the information indicative of the transistor-level circuit design, and determining at least one time delay associated with the transistor-level circuit design based on said at least one component of at least one cell.

19 Claims, 5 Drawing Sheets

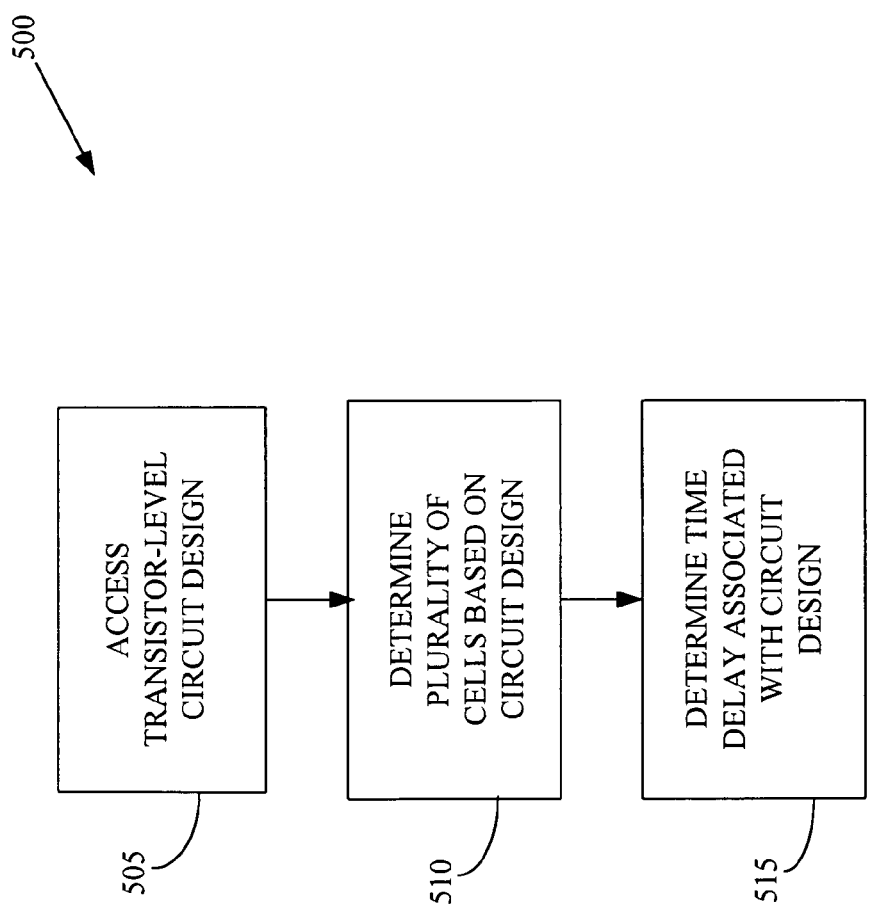

METHOD AND APPARATUS FOR DETERMINING CELL-BASED TIMING ELEMENTS FROM A TRANSISTOR-LEVEL DESIGN

BACKGROUND OF THE INVENTION

1. Field of the Invention

This invention relates generally to semiconductor devices, and, more particularly, to determining cell-based timing elements from a transistor-level design for a semiconductor device.

2. Description of the Related Art

Modern integrated circuits, including processors, memory elements, application-specific integrated circuits, and the like, typically include tens of thousands of individual transistors. The precise number of transistors, as well as the interconnections between the transistors and/or other elements of the integrated circuit, may be specified in a circuit design. In principle, circuit designs could be tested by fabricating a device based on the circuit design and then directly testing the device to make sure that it performs in the expected manner. However, configuring a semiconductor fabrication facility to fabricate the device and then fabricating one or more devices for testing would cost them in desirably large amount of time and/or money. Accordingly, circuit designs are typically tested by simulating the timing of the circuit design.

One technique for simulating a circuit design is to determine the circuit timing by simulating the interaction of individual transistors in the circuit. The most popular program for transistor-level simulation is the Simulation Program with Integrated Circuit Emphasis) (SPICE), which was developed at Berkeley starting in the 1970s, and is widely available in multiple forms today. Transistor-level simulation programs use a matrix-based technique for determining the circuit timing, which may make the transistor-level approach unwieldy and/or impractical for relatively large circuits, e.g. circuits that have in excess of about 10,000 transistors. Furthermore, transistor-level simulations typically require that the design engineer specify a particular path through the circuit design, e.g. in the form of a vector, in order to determine the time delay(s) associated with the path. Relatively large circuits may have numerous paths and the design engineer may have difficulty determining the correct path and, in some cases, may analyze an incorrect path. Some faster versions of transistor-level simulations may assume one or more heuristics in order to partition the circuit design.

Alternatively, the circuit design may be specified in terms of one or more cells. A cell-based circuit design specifies the properties of one or more cell elements and the interconnections between the cell elements. For example, the cell elements may include NAND gates, NOR gates, and the like. The cell-based circuit design may then specify the interconnections between the NAND gates and/or the NOR gates that are necessary to implement the logic and/or functions of the desired device. The particular arrangements of transistors that may be used to implement the cell elements are not typically specified by the cell-based circuit design. Instead, the transistor-level implementation is left undefined and design engineers are free to choose from among many possible transistor-level implementations of the cell elements.

Cell-based circuit designs may be simulated using static timing techniques. Static timing is a vectorless technique and so there is no need for the design engineer to specify a timing path through the circuit. Instead, a static timing simulator examines all possible paths through the circuit design. However, static timing cannot be applied directly to a transistor-level circuit design. Some static timing simulators include internal modules that attempt to convert transistor-level circuit designs to cell-based designs by modeling the transistor-level circuit design. However, when compared to cell-based static timing, these approaches typically have a low capacity and low control over the simulation. Furthermore, the models that are employed may impose a number of restrictions on the simulation. For example, the cells are only valid in context in which the cell is used.

SUMMARY OF THE INVENTION

The present invention is directed to addressing the effects of one or more of the problems set forth above. The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In one embodiment of the present invention, a method is provided for determining cell-based timing elements based on a transistor-level circuit design. The method may include accessing information indicative of a transistor-level circuit design determining at least one component of at least one cell based on the information indicative of the transistor-level circuit design, and determining at least one time delay associated with the transistor-level circuit design based on said at least one component of at least one cell.

BRIEF DESCRIPTION OF THE DRAWINGS

The invention may be understood by reference to the following description taken in conjunction with the accompanying drawings, in which like reference numerals identify like elements, and in which:

FIG. 5 conceptually illustrates one exemplary embodiment of a method of determining time delays associated with a transistor-level circuit design, in accordance with the present invention.

Figure 1:
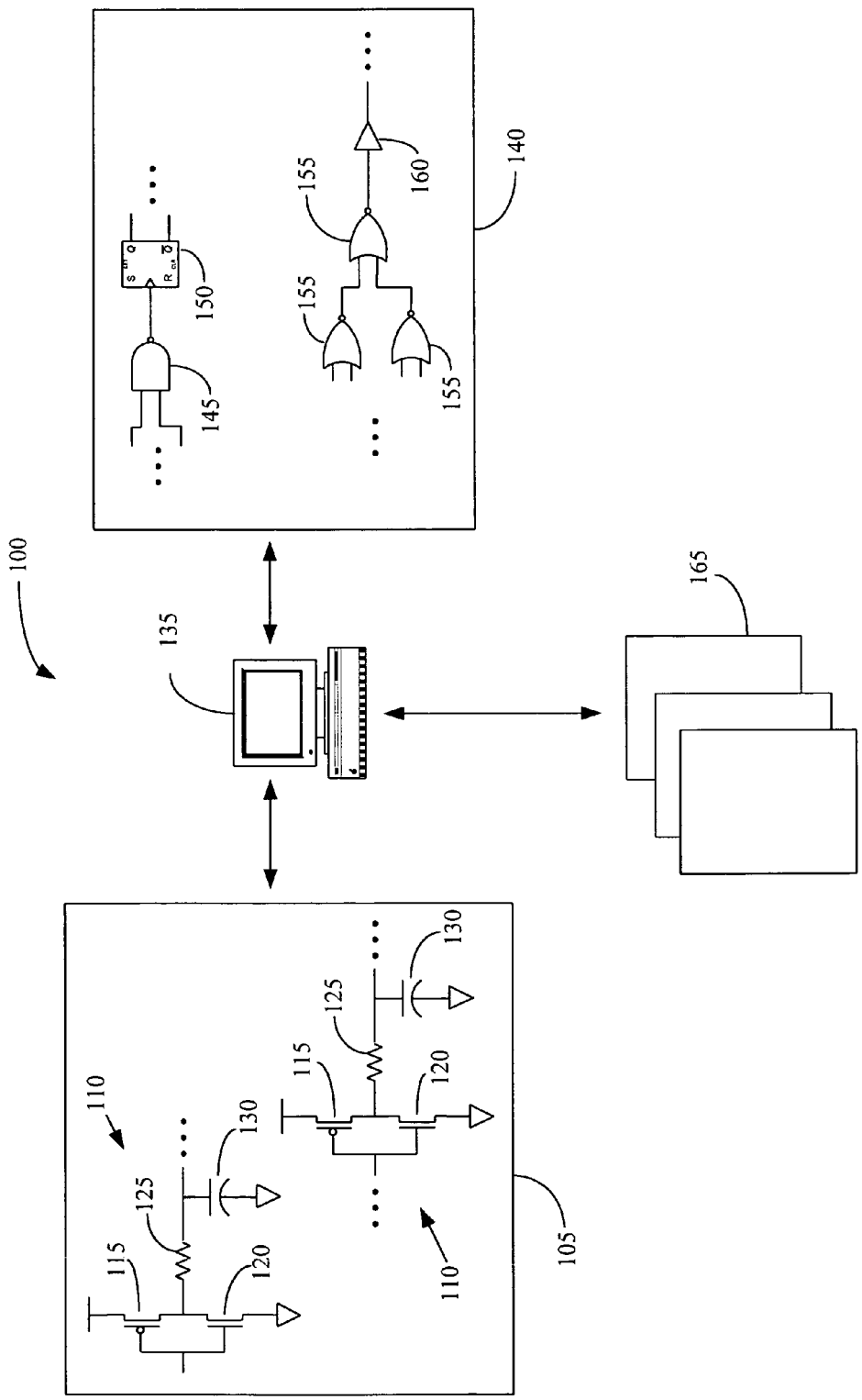
FIG. 1 conceptually illustrates one embodiment of a system for determining one or more timing delays associated with a circuit, in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions should be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Portions of the present invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 conceptually illustrates one embodiment of a system 100 for determining one or more timing delays associated with a circuit. In the illustrated embodiment, a transistor-level circuit design 105 is provided. For example, a design engineer may create the transistor-level circuit design 105 using a computer-aided design tool (not shown), in which case the transistor-level circuit design 105 may be provided in the form of one or more files and/or databases provided by the computer-aided design tool and/or a circuit analysis tool. As used herein, the term "transistor-level circuit design" refers to circuit designs that utilize individual transistors as the primary design element in the circuit. However, persons of ordinary skill in the art having benefit of the present disclosure should appreciate that transistor-level circuit designs are not necessarily exclusively composed of individual transistors. In some embodiments, the transistor-level circuit design 105 may include other functional elements.

In the illustrated embodiment, the transistor-level circuit design 105 includes inverters 110. Each inverter 110 includes and NMOS transistor 115 and a PMOS transistor 120. The inverters 110 may also include one or more resistances 125 and one or more capacitances 130. For example, the inverters 110 may include one or more parasitic resistances 125 and/or one or more parasitic capacitances 130. Persons of ordinary skill in the art having benefit of the present disclosure should appreciate that the inverters 110, as well as the particular implementation of the inverters 110 shown in FIG. 1, are intended to be illustrative and not to limit of the present invention. In alternative embodiments, the transistor-level circuit design 105 may include elements other than the inverters 110. For example, a typical transistor-level circuit design 105 may include up to about 1,000,000 individual transistors that may be used to form a variety of functional elements and/or devices including processors, memory elements, application-specific integrated circuits, and the like.

The system 100 also includes a processing unit 135. In the illustrated embodiment, the processing unit 135 is configured to access information indicative of the transistor-level circuit design 105. For example, the processing unit 135 may access one or more of the files and/or databases provided by a computer-aided design tool used to create the transistor-level circuit design 105 and/or a circuit analysis tool. For example, the processing unit 135 may access a transistor-level netlist file including information that characterizes the transistors as well as the connectivity between the transistors, a transistor-level detailed standard parasitic format (dspf) file including information that characterizes the resistances and/or capacitances between the transistors, and the like. Persons of ordinary skill in the art having benefit of the present disclosure should appreciate that the processing unit 135 may include any combination of hardware, firmware, and/or software. Furthermore, the processing unit 135 may be implemented a single device or may be distributed over multiple devices.

The processing unit 135 may then use the accessed information to determine one or more cells that are representative of the transistor-level circuit design 105. In the illustrated embodiment, the processing unit 135 uses the accessed information to form a cell-based circuit design 140 representative of the transistor-level circuit design 105. In contrast to the term "transistor-level circuit design," the term "cell-based circuit design" refers to circuit designs that utilize functional elements, i.e. cells, as the primary design element in the circuit. Cells may be implemented using different combinations of individual transistors and the particular combination of transistors used to implement the cell is typically a matter of design choice. Exemplary cells include but are not limited to NAND gates, NOR gates, and the like. However, persons of ordinary skill in the art having benefit of the present disclosure should appreciate that cell-based circuit designs are not necessarily exclusively composed of cells and may in some instances include individual transistors.

The cell-based circuit design 140 shown in FIG. 1 includes at least one NAND gate 145 coupled to a flip-flop 150. The cell-based circuit design 140 also includes NOR gates 155 coupled to each other, as well as to an inverter 160. Persons of ordinary skill in the art having benefit of the present disclosure should appreciate that the NAND gate 145, the flip-flop 150, the NOR gates 155, and the inverter 160 are intended to be exemplary and not to limit the present invention. In alternative embodiments, the cell-based circuit design 140 may include more or fewer elements that shown in FIG. 1. Moreover, persons of ordinary skill in the art should also appreciate that the NAND gate 145, the flip-flop 150, the NOR gates 155, and the inverter 160 are not intended to correspond in any way to the specific elements of the transistor-level design 105, e.g., the inverters 110, the NMOS transistor 115, the PMOS transistor 120, the resistances 125, and/or the capacitances 130.

In the illustrated embodiment, the processing unit 135 creates one or more files 165 indicative of the cell-based circuit design 140. For example, the processing unit 135 to create one or more verilog netlist files including information that characterizes the cells as well as the connectivity to other cells, one or more cell-based dspf files that include information indicative of resistances and/or capacitances between the cells (which may be obtained from a parasitic analysis of the transistor-level circuit design 105 and/or the cell-based circuit design 140), one or more Synopsis Liberty format (lib) files that include information indicative of one or more models for each of the generated cells and/or delay information associated with the cells, and the like. In one embodiment, the processing unit 135 may store the files 165 in any location, including memory located within the processing unit 135 and/or an external memory device (not shown).

The processing unit 135 may determine one or more time delays associated with the transistor-level circuit design 105 using the cell-based circuit design 140 and/or the information stored in the files 165. For example, the files 165 may include one or more verilog netlist files, one or more cell-based dspf files, and one or more lib files that may be provided to a static timing analysis tool (not shown) implemented in the processing unit 135. The processing unit 135 may then determine one or more time delays associated with the transistor-level circuit design 105 using conventional static timing analysis techniques. These techniques are known to persons of ordinary skill in the art and in the interest of clarity only those aspects of static timing analyses that are relevant to the present invention will be discussed further herein.

Figure 2A:
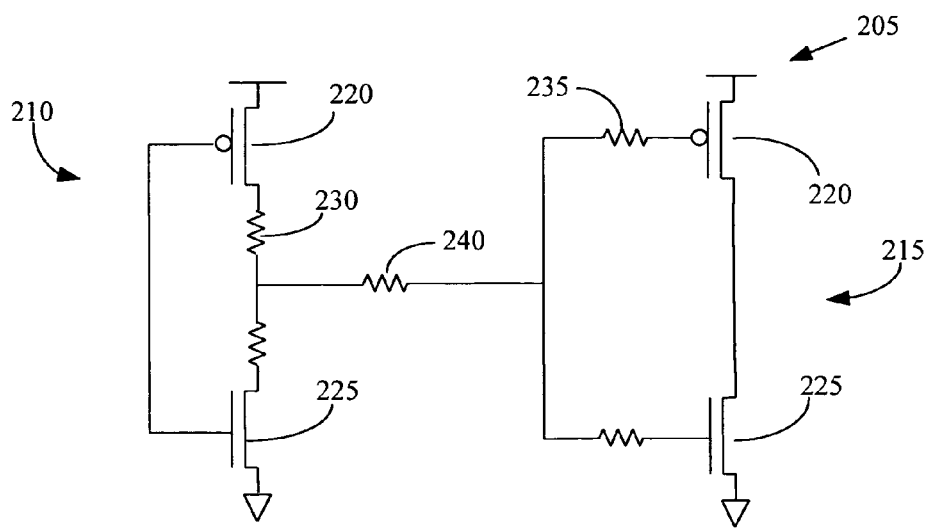
FIGS. 2A-C conceptually illustrate one exemplary embodiment of a technique for determining a cell-based circuit design based on a transistor-level circuit design, in accordance with the present invention.
Figure 2B:
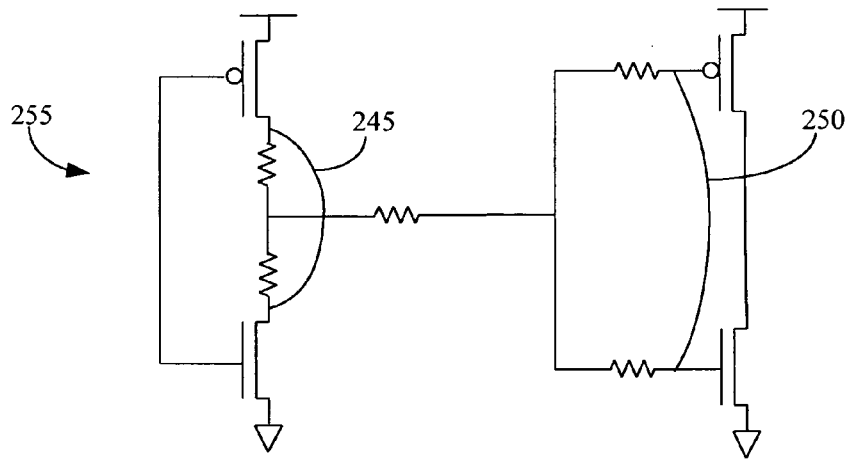
Figure 2C:
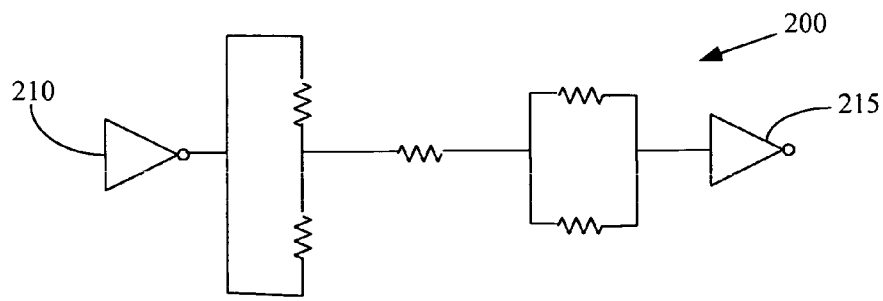

FIGS. 2A-C conceptually illustrate one exemplary embodiment of a technique for determining a cell-based circuit design 200 based on a transistor-level circuit design 205. FIG. 2A shows one exemplary embodiment of the transistor-level circuit design 205, which includes inverters 210, 215. The inverters 210, 215 include a PMOS transistor 220 and an NMOS transistor 225. In the illustrated embodiment, the inverters 210, 215 may be characterized by internal resistances 230, 235, respectively. The inverters 210, 215 are coupled by a line that includes a resistance 240. In one embodiment, the transistor-level circuit design 205 is represented by a transistor-level netlist extracted from the layout of the transistor-level circuit design 205, which may be represented in a GDSII stream format file.

Information indicative of a cell-based circuit design 200 may then be generated based on the transistor-level circuit design 205. In one embodiment, one or more nodes in the resistor tree that are connected to each output node of each cell are determined. These nodes are then shorted together to the output pin of the cell. Likewise, for each receiver of the parasitic network, all of the nodes in the resistor network that are connected to the gates (or source/drains) of transistors that are connected to the same receiver pin of the receiver cell may be hooked together. For example, as shown in FIG. 2B, resistors 230 may be shorted using line 245 and the resistors 235 may be shorted using line 250. In the illustrated embodiment, the information indicative of the cell-based circuit design 200 shown in FIG. 2C is generated using the modified design 255 shown in FIG. 2B. For example, a dspf and/or an spef netlist file that hooks up output pins of driver cells to input pins of receiver cells may be created. These parasitic files provide resistor and capacitor networks at the output nodes of the cells, e.g., in a cell-level verilog netlist file. The parasitic network can be either a resistance-capacitance (RC) or resistance-coupled capacitance (RCC) netlist file, depending upon whether coupling capacitances should to be taken into account. With the parasitic network, a cell-based static timing tool, like Primetime, can calculate the impact of resistance and capacitance on timing.

Figure 3:
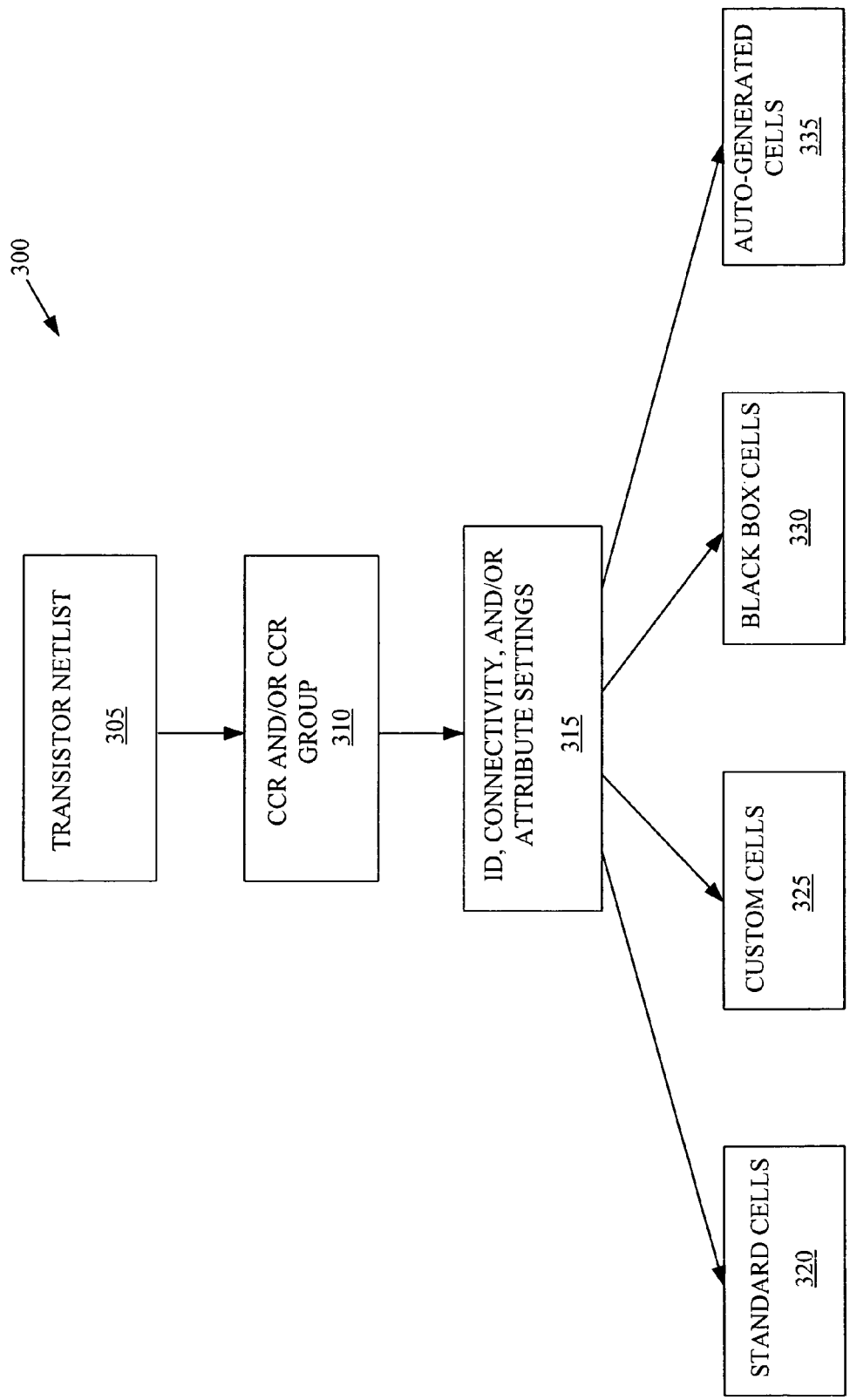
FIG. 3 conceptually illustrates one exemplary embodiment of a technique for creating information indicative of a cell-based circuit design, in accordance with the present invention.

FIG. 3 conceptually illustrates one exemplary embodiment of a technique 300 for creating information indicative of a cell-based circuit design. In one embodiment, the information may include a cell-based netlist and/or cell-based parasitics that may be used to run a static timing analysis of the cell-based circuit design, e.g., in Primetime. For example, a verilog netlist file may used to indicate connectivity of the cells and dspf or spef files may be used to indicate the parasitics. In one embodiment, such as systems that work on flat transistor-level extracted netlists, transistor-level netlists 305 may be accessed and/or generated. For example, flat verilog netlists for cell-based flows or custom verilog netlists for transistor-based flows (i.e. macros and/or arrays) may be accessed and/or generated. Once the transistors in the transistor netlist 305 are grouped together to create verilog netlists, a parasitic netlist may be created in dspf or spef format.

The transistor-level netlist 305, which may or may not include information indicative of parasitics, may be partitioned so that the transistors are associated with one or more channel-connected regions (CCRs). One or more CCRs may be grouped into one or more channel-connected region groups (CCRGroups) 310. The identity, connectivity, and/or attribute settings 315 associated with the CCRs and/or CCR-Groups 310 may be determined. In one embodiment, the CCRs and/or CCRGroups 310 may be identified based on internal rules that define various circuit classes such as combinatorial static CMOS gates, cascade voltage switch logic (CVSL), transmission gates, and dynamic gates. In addition, various attributes of the CCRs and/or CCRGroups 310 may be set, such as strengths, capacitances, and the like. The connectivity between the CCRs and/or CCRGroups 310 may also be set to allow traversal from one CCR and/or CCR-Group 310 to one or more other CCRs and/or CCRGroups 310.

The CCRs and/or CCRGroups 310 may be combined together to form cells of various types. In one embodiment, the cells may be standard cells 320, custom cells 325, black box cells 330, auto-generated cells 335, and the like. The cell based blocks 320, 325, 330, 335 may be composed of cell primitives. For example, a flat verilog netlist may be generated in the process of running timing and formal verification as part of the cell-based flow. The standard cells 320 may be formed based partly on data files written out from a schematic netlister to provide partitioning for the standard cells 320. In one embodiment, the standard cells 320 in the cell-based netlist may be assumed to interface to each other through gate boundaries. For example, under this assumption, an inverter from one standard cell 320 cannot drive directly into the source/drains of another standard cell 320, except for special cases like an unbuffered transmission gate.

The schematic netlister may provide a map file including the cell data. For example, the map file may be provided in a simplified verilog format with the following format:

InstanceName CellName NodeName.PinName [NodeName.PinName] . . .

The map file may be used to re-create an original verilog hierarchy by stripping off the instance hierarchy from all transistors until a matching cell instance is found from one or more of the cells in the mapping file. The transistor and/or corresponding CCR may then be attached to the cell. In some embodiments, additional assumptions may be made when performing the standard cell mapping. For example, each transistor may be assumed to belong to only one cell. For another example, a schematic hierarchy that is reproduced in the extracted netlist may be assumed to be present.

The black box cells 330 may be characterized by the user/designer. The black box cells 330 may also have their own level of hierarchy in the design schematic. For example, a 6T SRAM cell may be characterized using a black box cell 330. The schematic hierarchy does not need to have a corresponding layout view as long as there is a schematic view at the next level up in the hierarchy that can be used for characterization. For another example, a sense-amplified array may be characterized as a black box cell 330 by placing an entire column or columns and the sense amplifier in a schematic. In one embodiment, the schematic netlister creates a mapping file that may contain the mapping information for the black-box cells 330. The mapping file may then be read and used to group CCRs together to form the CCRGroups 310, which may be become cells in a verilog netlist. Any transistors which are not part of cells from the mapping file may be automatically partitioned into CCRs and CCRGroups 310 and also become verilog instances.

Auto generated cells 335 may be automatically recognized and/or characterized. For example, functional cells such as static CMOS cells, footed and/or footless dynamic cells, and CVSL cells may be automatically partitioned into auto-generated cells 335. Since some gates with the same sizes may be re-used frequently in an array, similar gates may be folded together based on one or more selected criteria. For example, similar gates may be folded together based on whether their transistor widths, lengths, areas, and/or internal caps match within a selected tolerance or range. In some embodiments, arc generation for an individual CCR or CCRGroup 310 (or a folded group of CCRs or CCRGroups 310) may be overridden. Accordingly, folding of auto-generated cells 335 may be prevented on a case by case basis. In some embodiments, such as embodiments that include transmission gates that have multiple CCRs, CCRs may be combined into CCRGroups if the CCRs share one or more transistors. Since CCRGroups support multiple output nodes, this may be a convenient way of representing these gates for characterization.

Custom cells 325 may also be defined or created. As in the verilog netlist generation flow used for the standard cells 320, custom cells 325 may use the cell-based mapping already available in the schematic hierarchy. However, there may be cases in which the parasitics for the same standard cell 320 are different. In this case, the standard cells 320 and custom cells 325 may be folded to create different variants of the same cell if the internal cell parasitics are different. Then, each version of the cell will be characterized separately. This should provide the most accurate static timing results at the expense of run-time.

The cells 320, 325, 330, 335 may also be characterized based in part on the transistor-level circuit design. In one embodiment, characterizing the cells 320, 325, 330, 335 includes generating lib files for the cells, which may be used for the static timing analysis Techniques for generating the lib files may vary depending upon the cell type. The lib files for the standard cells 320 may be generated using a cell characterization flow in which an extracted netlist is formed by placing a metal grid over the standard cell 320 and assuming worst case coupling of the overlay routes on the wires below. The standard cells 320 may be characterized for varying slew and loads so they can be used within any environment in the design.

As discussed above, custom cells 325 may include cells defined by the designer to handle cases in which a new combinatorial static CMOS cell is needed because there is no appropriate cell in the library. One characteristic of a custom cell 325 is that the outputs of the custom cell 325 can be specified as a logical expression of the inputs. In these cases, arcs for characterization may be generated and the custom cell 325 may be sensitized for best and worst case delay and/or simultaneous switching.

Black box cells 330 may be defined by the designer to cover special cases in which the cell function cannot be expressed as logic equations and/or setup or hold constraints are associated with the cell (i.e. 6T SRAM cells) because the black box cell 330 has state. To handle the black box cells 330, the designer may create the appropriate configuration files for the cell characterization tool to calculate the timing arcs, the setup times, and/or hold times.

Auto-generated cells 335 may be formed by automatically partitioning transistors that are not standard cells 320 or black boxes 330 in the rest of the netlist into cells. The config files may control characterization at the stews and/or loads appropriate for various uses in the netlist. For example, auto-generated cells 335 may include gates such as static CMOS, dynamic, CVSL, transmission gates, and other internally recognized types. Auto-generated cells 335 that are identified as static CMOS or transmission gates, the cell 335 may be characterized using a wrapper. In various embodiments, the wrapper may indicate the logic function, input edge rates, output load capacitances, the cell netlist, and the like. The input edge rates may be determined based on the edge rate ranges used for the design. The output load capacitances may be determined based on the range of capacitive loads seen by the cell in the netlist. The logic function may be determined by examining all paths to VDD and VSS from the output node. Given the logic function, the possible side input conditions for a given primary input and output transition may be determined. The worst case arc for each input of the cell to put in the lib file may be determined by simulating all of these possibilities.

Figure 4:
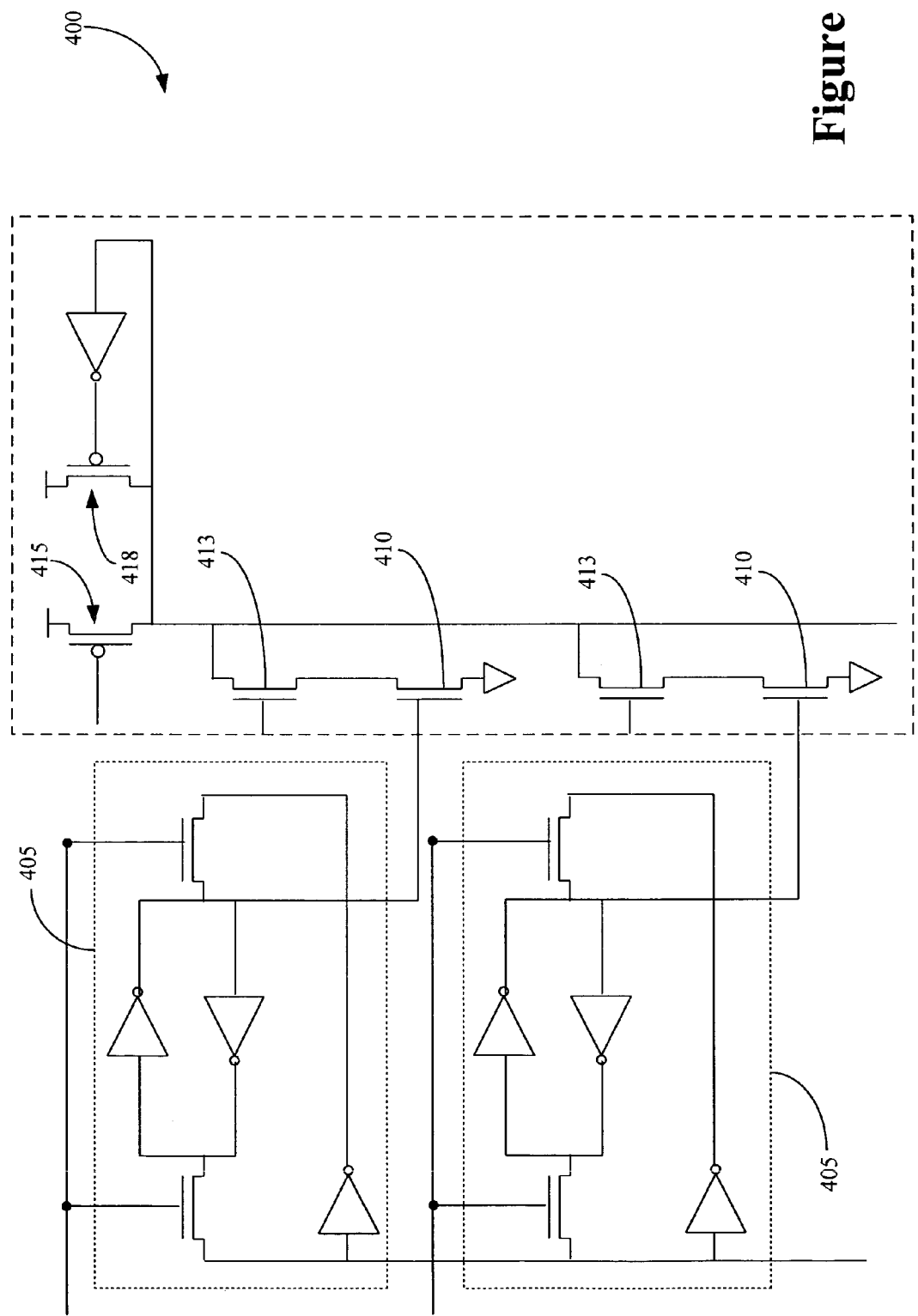
FIG. 4 conceptually illustrates one exemplary embodiment of a transistor-level circuit design for a register column, in accordance with the present invention.

FIG. 4 conceptually illustrates one exemplary embodiment of a transistor-level circuit design for a register column 400.

In the illustrated embodiment, the register column 400 includes two memory cells 405, such as 6T SRAM cells. Read-port transistors 410 and clock transistors 413 for each memory cell 405 are included in the cell layout and the read-port transistors 410 and/or the clock transistors 413 may be part of the layout cell. The register column 400 also includes a pre-charge transistor 415 and a keeper transistor 418. In the illustrated embodiment, the pre-charge transistors 415 and/or the keeper transistors 418 may be in a separate cell since they may impact the entire read bit-line. The read bit-line transistor, including the read-port transistors 410, the clock transistors 413, the pre-charge transistor 415 and/or the keeper transistors 418, may be partitioned into a dynamic gate regardless of how they are specified in the schematic hierarchy to form an auto-generated cell 420. The 6T SRAM cells 405 may each become a black box cell.

FIG. 5 conceptually illustrates one exemplary embodiment of a method 500 of determining time delays associated with a transistor-level circuit design. In the illustrated embodiment, information indicative of the transistor-level circuit design is accessed (at 505). For example, a computer-aided design tool may provide files representative of the transistor-level circuit design, and the provided files may be stored in memory element and then accessed (at 505) by a processing unit. One or more cells may then be determined (at 510) based on the transistor-level circuit design, as discussed in detail above. One or more time delays associated with the transistor-level circuit design may be determined (at 515) based on the one or more cells. For example, information that characterizes the cells and describes the interconnections between the cells may be used to determine (at 515) the one or more time delays using a static timing tool, such as Primetime.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    accessing, by a processing unit, information indicative of a transistor-level circuit design that characterizes a plurality of transistors in a circuit, connectivity between the transistors, and transistor-level parasitics;
    generating, in the processing unit, a cell-level circuit design based on the transistor-level circuit design, the cell-level circuit design comprising a plurality of cells, each cell being characterized by the information indicative of the transistor-level circuit design prior to initiating a static timing analysis, wherein generating the cell-level circuit design comprises determining at least one component of at least one of a channel-connected region or a channel-connected region group, wherein determining said at least one component of at least one of a channel-connected region and a channel-connected region group comprises folding together gates that match within a selected tolerance or range; and
    applying, in the processing unit, the static timing analysis to the cell-level circuit design to determine at least one time delay associated with the transistor-level circuit design.

2. The method of claim 1, wherein accessing the information indicative of the transistor-level circuit design comprises accessing information provided by a computer-aided design tool.

3. The method of claim 1, wherein determining said at least one component of at least one of a channel-connected region and a channel-connected region group comprises determining said at least one component of at least one of a channel-connected region and a channel-connected region group based on at least one internal rule associated with at least one circuit class.

4. The method of claim 1, wherein determining said at least one component of at least one of a channel-connected region and a channel-connected region group comprises determining at least one component of at least one of a standard cell, a custom cell, a black box cell, and an auto-generated cell.

5. The method of claim 1, wherein generating the cell-level circuit design comprises determining at least one of a resistance, a capacitance, and a delay associated with each of the plurality of cells.

6. The method of claim 1, wherein generating the cell-level circuit design comprises generating a plurality of parasitic networks based on the transistor-level parasitics.

7. The method of claim 6, wherein generating the plurality of parasitic networks comprises shorting together selected nodes of the transistor-level circuit design.

8. The method of claim 7, wherein generating the plurality of parasitic networks comprises generating at least one of a resistance-capacitance or a resistance-coupled capacitance netlist file.

9. The method of claim 8, wherein applying the static timing analysis to the cell-level circuit design comprises applying the static timing analysis to said at least one of a resistance-capacitance or a resistance-coupled capacitance netlist file.

10. An apparatus, comprising:
    means for accessing information indicative of a transistor-level circuit design that characterizes a plurality of transistors in a circuit, connectivity between the transistors, and transistor-level parasitics;
    means for generating a cell-level circuit design based on the transistor-level circuit design, the cell-level circuit design comprising a plurality of cells, each cell being characterized by the information indicative of the transistor-level circuit design prior to initiating a static timing analysis, wherein generating the cell-level circuit design comprises determining at least one component of at least one of a channel-connected region or a channel-connected region group, wherein determining said at least one component of at least one of a channel-connected region and a channel-connected region group comprises folding together gates that match within a selected tolerance or range; and
    means for applying the static timing analysis to the cell-level circuit design to determine at least one time delay associated with the transistor-level circuit design.

11. An apparatus, comprising:
    a processing unit configured to:
        access information indicative of a transistor-level circuit design that characterizes a plurality of transistors in a circuit, connectivity between the transistors, and transistor-level parasitics;
        generate a cell-level circuit design based on the transistor-level circuit design, the cell-level circuit design comprising a plurality of cells, each cell being characterized by the information indicative of the transistor-level circuit design, wherein generating the cell-level circuit design comprises determining at least one component of at least one of a channel-connected region or a channel-connected region group, wherein determining said at least one component of at least one of a channel-connected region and a channel-connected region group comprises folding together gates that match within a selected tolerance or range; and apply the static timing analysis to the cell-level circuit design to determine at least one time delay associated with the transistor-level circuit design based on said at least one component of at least one cell.

12. The apparatus of claim 11, wherein the processing unit is configured to access information provided by a computer-aided design program.

13. The apparatus of claim 11, wherein the processing unit is configured to determine said at least one component of at least one of a channel-connected region and a channel-connected region group based on at least one internal rule associated with at least one circuit class.

14. The apparatus of claim 11, wherein the processing unit is configured to determine at least one component of at least one of a standard cell, a custom cell, a black box cell, and an auto-generated cell.

15. The apparatus of claim 11, wherein the processing unit is configured to determine at least one of a resistance, a capacitance, and a delay associated with each of the plurality of cells.

16. The apparatus of claim 11, wherein the processing unit is configured to generate a plurality of parasitic networks based on the transistor-level parasitics.

17. The apparatus of claim 16, wherein the processing unit is configured to short together selected nodes of the transistor-level circuit design.

18. The apparatus of claim 17, wherein the processing unit is configured to generate at least one of a resistance-capacitance or a resistance-coupled capacitance netlist file for each of the plurality of parasitic networks.

19. The apparatus of claim 18, wherein the processing unit is configured to apply the static timing analysis to said at least one of a resistance-capacitance or a resistance-coupled capacitance netlist file.

* * * * *